United States Patent
Gatto

(10) Patent No.: US 11,456,375 B2
(45) Date of Patent: Sep. 27, 2022

(54) SEMICONDUCTOR DEVICE INCLUDING FIRST AND SECOND DUMMY TRENCH GATES

(71) Applicant: Mitsubishi Electric Corporation, Tokyo (JP)

(72) Inventor: Ayanori Gatto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/005,828

(22) Filed: Aug. 28, 2020

(65) Prior Publication Data

US 2021/0202723 A1 Jul. 1, 2021

(30) Foreign Application Priority Data

Dec. 25, 2019 (JP) .............................. JP2019-233863

(51) Int. Cl.
*H01L 29/73* (2006.01)
*H01L 29/739* (2006.01)
*H01L 29/06* (2006.01)
*H01L 29/10* (2006.01)
*H01L 29/66* (2006.01)
(Continued)

(52) U.S. Cl.
CPC ........ *H01L 29/7397* (2013.01); *H01L 21/765* (2013.01); *H01L 29/0696* (2013.01); *H01L 29/1095* (2013.01); *H01L 29/404* (2013.01); *H01L 29/407* (2013.01); *H01L 29/66348* (2013.01)

(58) Field of Classification Search
CPC ............. H01L 29/7397; H01L 29/0696; H01L 29/1095; H01L 29/66348; H01L 29/407; H01L 21/765; H01L 29/404; H01L 29/4238

USPC ......................................................... 257/139
See application file for complete search history.

(56) References Cited

U.S. PATENT DOCUMENTS

2003/0042537 A1* 3/2003 Nakamura .......... H01L 29/7395
257/328
2009/0283797 A1* 11/2009 Takahashi ........... H01L 29/7397
257/E29.198
(Continued)

FOREIGN PATENT DOCUMENTS

JP 2019-186318 A 10/2019

*Primary Examiner* — Mohammad M Hoque
(74) *Attorney, Agent, or Firm* — Studebaker & Brackett PC

(57) ABSTRACT

Provided is a semiconductor device including: a semiconductor substrate having at least first and second semiconductor layers of a first conductivity type, a third semiconductor layer of a second conductivity type, and a fourth semiconductor layer of the first conductivity type selectively provided in an upper layer portion of the third semiconductor layer; a trench gate passing through the fourth and third semiconductor layers in a thickness direction to penetrate into the second semiconductor layer; a first dummy trench gate passing through the third and second semiconductor layer in the thickness direction to penetrate into the first semiconductor layer; and a second dummy trench gate passing through the third semiconductor layer in the thickness direction to penetrate into the second semiconductor layer, the first and second dummy trench gates being disposed between the trench gates arrayed and being electrically connected to a first main electrode.

9 Claims, 19 Drawing Sheets

(51) Int. Cl.
*H01L 29/40* (2006.01)
*H01L 21/765* (2006.01)

(56) References Cited

U.S. PATENT DOCUMENTS

| | | | |
|---|---|---|---|
| 2014/0077256 A1* | 3/2014 | Hikasa | H01L 29/7397 |
| | | | 257/139 |
| 2016/0372585 A1* | 12/2016 | Furukawa | H01L 29/0821 |
| 2017/0018547 A1* | 1/2017 | Naito | H01L 29/0615 |
| 2017/0025522 A1* | 1/2017 | Naito | H01L 29/407 |
| 2017/0110562 A1* | 4/2017 | Chen | H01L 29/0696 |
| 2019/0027592 A1* | 1/2019 | Tanabe | H01L 29/0821 |
| 2019/0312113 A1 | 10/2019 | Chen | |
| 2020/0126877 A1* | 4/2020 | Takaoka | H01L 29/7813 |
| 2020/0287029 A1* | 9/2020 | Ishikawa | H01L 29/0696 |

\* cited by examiner

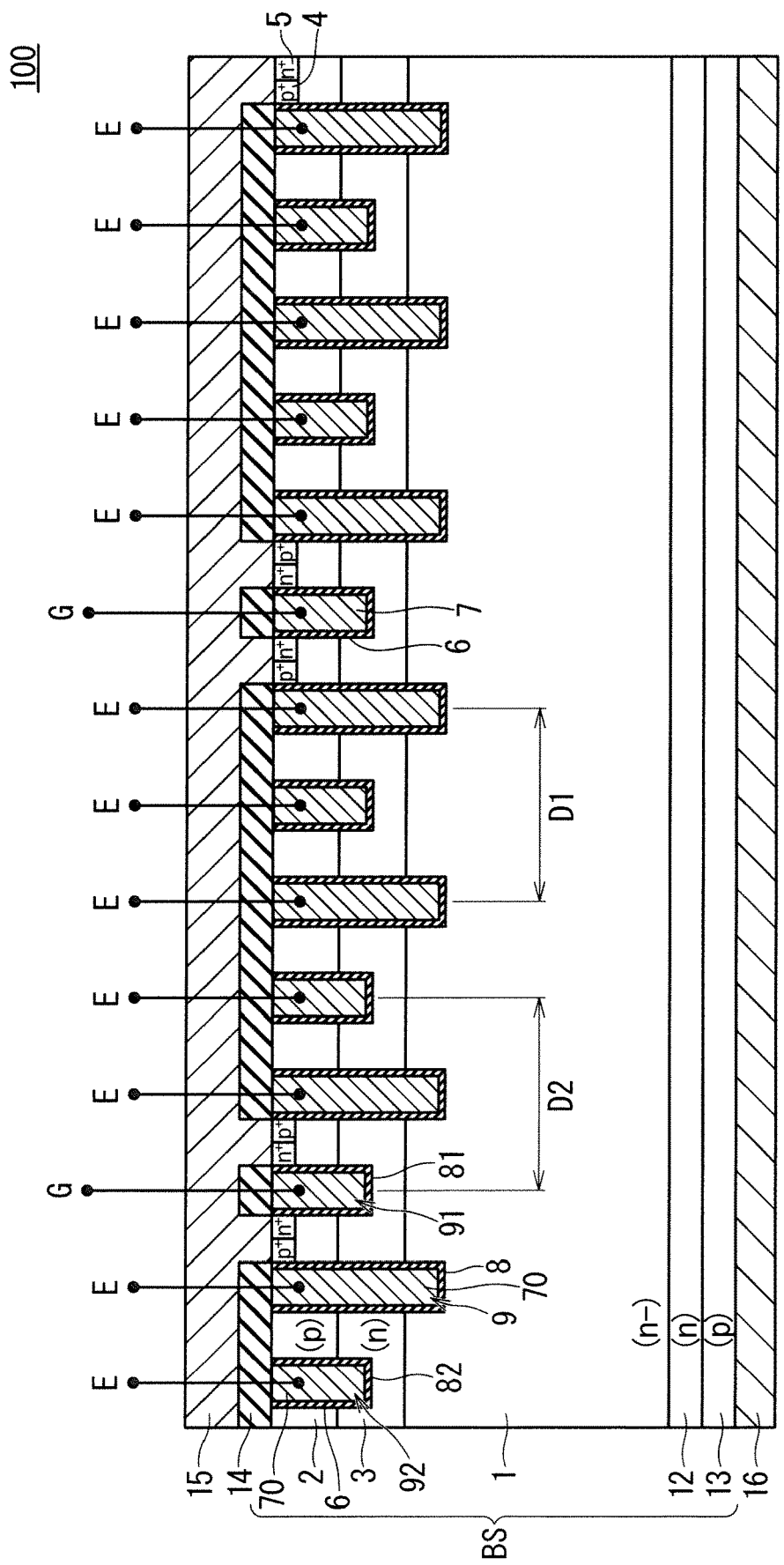
F I G. 1

F I G. 4
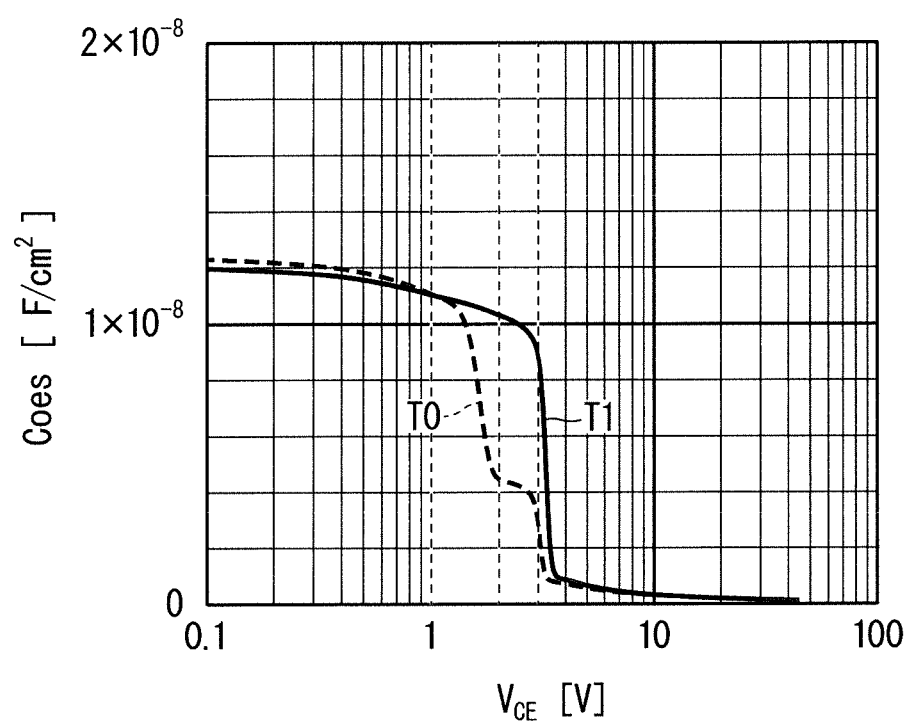

F I G. 5
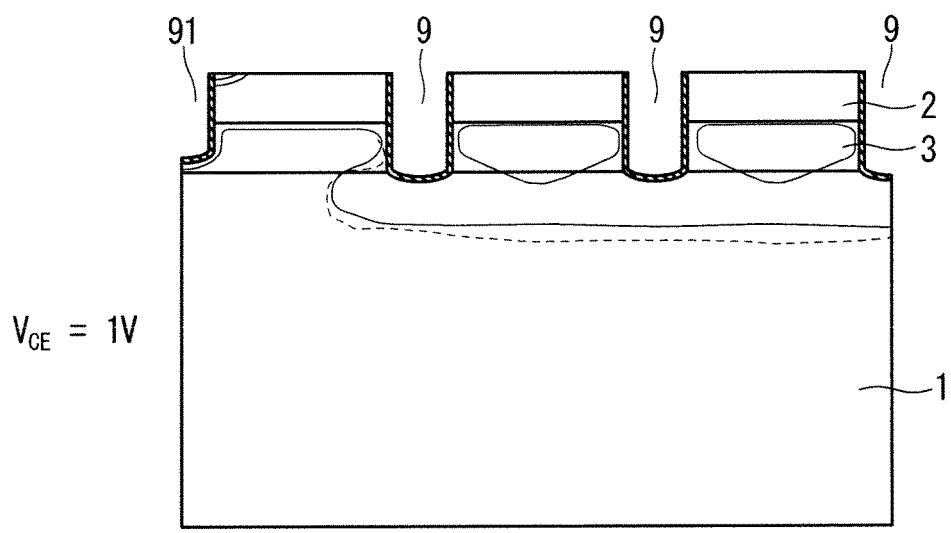
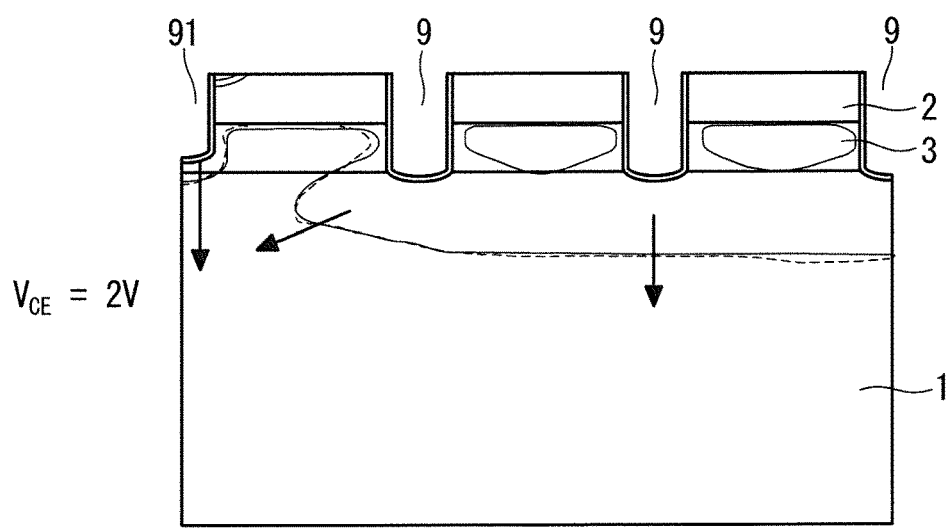
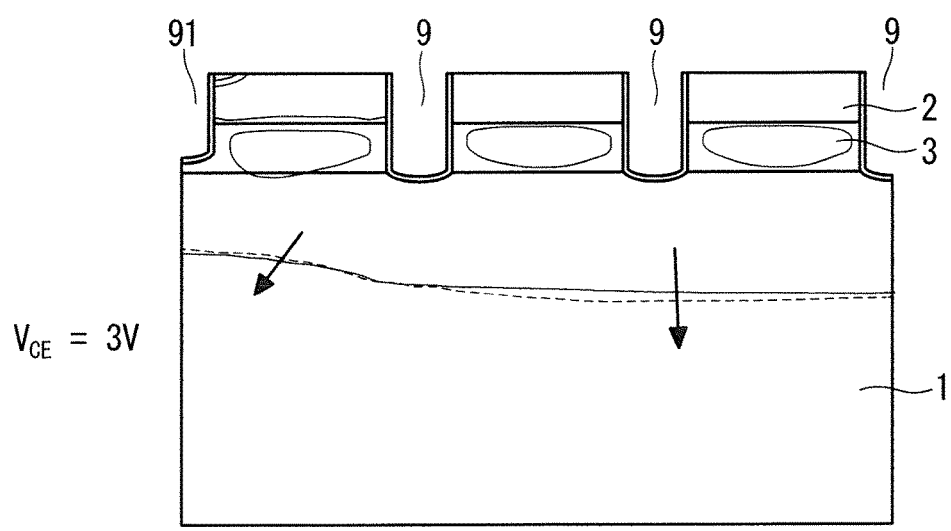

SEMICONDUCTOR DEVICE INCLUDING FIRST AND SECOND DUMMY TRENCH GATES

BACKGROUND OF THE INVENTION

Field of the Invention

The present disclosure relates to a semiconductor device, and particularly to a semiconductor device including a trench gate.

Description of the Background Art

For example, Japanese Patent Application Laid-Open No. 2019-186318 discloses an insulated gate bipolar transistor (IGBT) in FIG. 1 as a conventional semiconductor device provided with a trench gate, the IGBT including a plurality of trench gates serving as gate electrodes each of which is formed by providing a gate trench in one main surface of a semiconductor substrate, covering an inner surface of the gate trench with a gate oxide film, and embedding polysilicon in the gate trench having the inner surface covered with the gate oxide film.

The IGBT further includes one or more dummy trench gates each serving as a dummy gate electrode, which are formed by providing one or more dummy gate trenches between the trench gates adjacent to each other, the one or more dummy gate trenches being deeper than the trench gates, covering an inner surface of each of the one or more dummy gate trenches with a gate oxide film, and embedding polysilicon in the one or more dummy gate trenches each having the inner surface covered with the gate oxide film. The dummy gate electrode receives an emitter potential.

As described above, although the conventional IGBT includes the dummy gate trenches that are each provided between the trench gates adjacent to each other and that each have a deeper trench than the trench gates, the IGBT has peculiar capacitance-voltage characteristics in a ⅚ thinning placement where the trench gates and the dummy trench gates are disposed at a ratio of 1:5, for example. This may cause gate voltage oscillation and switching malfunction depending on usage conditions.

SUMMARY

Provided is a semiconductor device that does not have peculiar capacitance-voltage characteristics even in a structure having a trench gate and a dummy trench gate.

Semiconductor device according to the present disclosure includes: a semiconductor substrate having at least a first semiconductor layer of a first conductivity type, a second semiconductor layer of the first conductivity type on the first semiconductor layer, a third semiconductor layer of a second conductivity type on the second semiconductor layer, and a fourth semiconductor layer of the first conductivity type that is selectively provided in an upper layer portion of the third semiconductor layer; a trench gate passing through the fourth semiconductor layer and the third semiconductor layer in a thickness direction to penetrate into the second semiconductor layer; a first dummy trench gate passing through the third semiconductor layer and the second semiconductor layer in the thickness direction to penetrate into the first semiconductor layer; a second dummy trench gate passing through the third semiconductor layer in the thickness direction to penetrate into the second semiconductor layer; a first main electrode in contact with at least the fourth semiconductor layer; and a second main electrode provided on the semiconductor substrate on a side opposite to the first main electrode in the thickness direction, the first and second dummy trench gates being disposed between the trench gates arrayed and being electrically connected to the first main electrode.

According to the above semiconductor device, disposing the first and second dummy trench gates between the trench gates arrayed enables obtaining a semiconductor device that does not have peculiar capacitance-voltage characteristics.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 1 is a sectional view illustrating a structure of an IGBT according to a first preferred embodiment;

FIGS. 3 and 4 are each a graph showing a simulation result of capacitance-voltage characteristics;

FIG. 5 is a diagram illustrating an internal analysis result using a conventional IGBT simulation;

DESCRIPTION OF THE PREFERRED EMBODIMENTS

<Introduction>

Figure 2:
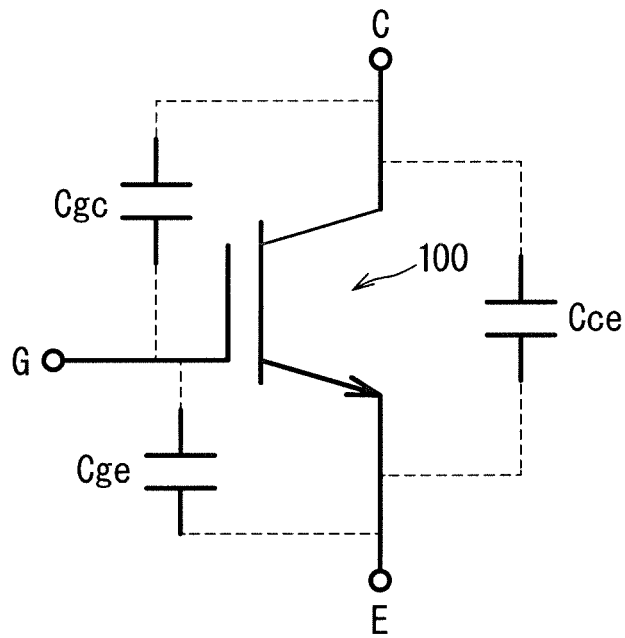
FIG. 2 is an equivalent circuit diagram of parasitic capacitance of the IGBT.

Hereinafter, preferred embodiments will be described with reference to the accompanying drawings. The drawings are each schematically illustrated, and a mutual relationship between size and position of images each illustrated in the different drawings is not necessarily accurately illustrated and may be appropriately changed. In the following description, similar components are denoted by the same reference numerals, and their names and functions are also similar. Thus, detailed description thereof may be eliminated.

Even when terms each meaning a specific position and direction, such as "above", "below", "side", "bottom", "front", or "back", are used in the description below, these terms are used for convenience to facilitate understanding of contents of a preferred embodiment, and are each not related to a direction at the time of actual implementation. In the following, "outside" is a direction toward an outer periphery of a semiconductor device, and "inside" is a direction opposite to the "outside".

While an impurity conductivity type is generally defined as follows: an n-type is a "first conductivity type" and a p-type is a "second conductivity type", in the following description, an opposite definition may be used.

First Preferred Embodiment

<Device Structure>

FIG. 1 is a sectional view illustrating a structure of an IGBT 100 according to a first preferred embodiment. As illustrated in FIG. 1, the IGBT 100 includes a semiconductor substrate BS having a p-type collector layer 13, an n-type buffer layer 12, an n-type drift layer 1 (first semiconductor layer), an n-type carrier store layer 3 (second semiconductor layer), a p-type channel layer 2 (third semiconductor layer), and an n-type emitter layer 5 (fourth semiconductor layer) provided in an upper layer portion of the channel layer 2. The upper layer portion of the channel layer 2 also includes a p-type emitter layer 4 provided outside the emitter layer 5, being in contact with a side surface of the emitter layer 5. The p-type emitter layer 4 may also be referred to as a contact layer. Although a silicon substrate can be used as the semiconductor substrate BS, a wide band gap semiconductor substrate such as a silicon carbide substrate may be used.

Here, each layer has an allowable range of a peak concentration of impurities as follows: $1\times10^{12}$ to $3\times10^{14}$ (cm$^{-3}$) for the n-type drift layer 1; $1\times10^{16}$ to $1\times10^{18}$ (cm$^{-3}$) for the p-type channel layer 2; $1\times10^{15}$ to $1\times10^{17}$ (cm$^{-3}$) for the n-type carrier store layer 3; $1\times10^{18}$ to $1\times10^{20}$ (cm$^{-3}$) for the p-type emitter layer 4; and $1\times10^{18}$ to $5\times10^{20}$ (cm$^{-3}$) for the n-type emitter layer 5. The n-type buffer layer 12 has an allowable range of $1\times10^{14}$ to $1\times10^{17}$ (cm$^{-3}$), and the p-type collector layer 13 has an allowable range of $1\times10^{16}$ to $1\times10^{19}$ (cm$^{-3}$).

The drift layer 1 has a lower impurity concentration than the carrier store layer 3 and is represented by "n$^-$" in the corresponding drawings. The p-type emitter layer 4 has a higher impurity concentration than the channel layer 2 and is represented by "p$^+$" in the corresponding drawings. The n-type emitter layer 5 has a higher impurity concentration than the carrier store layer 3 and is represented by "n$^+$" in the corresponding drawings.

The semiconductor substrate BS has a first main surface (lower main surface) provided with the collector layer 13, the first main surface including a collector electrode 16 (second main electrode). The semiconductor substrate BS has a second main surface (upper main surface) opposite to the lower main surface, the second main surface including a plurality of gate trenches 81 passing through the emitter layer 5 and the channel layer 2 in the thickness direction from an outermost surface of the emitter layer 5 to penetrate into the carrier store layer 3.

Each of the gate trenches 81 has an inner surface covered with a gate oxide film 6, and a gate electrode 7 made of polysilicon is embedded into each of the gate trenches 81, having the inner surface covered with the gate oxide film 6, to form a trench gate 91.

Between trench gates 91 adjacent to each other, a dummy gate trench 8 deeper than the gate trench 81 and a dummy gate trench 82 equal in depth to the gate trench 81 are alternately provided.

The dummy gate trenches 8 and 82 each have an inner surface covered with the gate oxide film 6, and dummy gate electrodes 70 made of polysilicon are embedded into the dummy gate trenches 8 and 82, each having the inner surface covered with the gate oxide film 6, to form a dummy trench gate 9 (first dummy trench gate) and a dummy trench gate 92 (second dummy trench gate), respectively.

As described above, dummy trench gates 9 and dummy trench gates 92 are alternately disposed between the trench gates 91 arrayed, and the dummy trench gates 9 are disposed adjacent to the corresponding trench gates 91.

An interlayer insulating film 14 is provided continuously covering upper portions of the trench gates 91 and upper portions of the dummy trench gates 9 and 92. A contact opening is formed in a portion between each of the trench gates 91 and the corresponding one of the dummy trench gates 9, the portion being not covered with the interlayer insulating film 14. An emitter electrode 15 (first main electrode) is provided covering the interlayer insulating film 14 and the contact openings. Although the gate electrode 7 receives a gate potential, a dummy gate electrode 70 is electrically connected to the emitter electrode 15 to receive an emitter potential, and does not function as a gate electrode.

A placement interval D1 (first placement interval) defined by a center-to-center distance between the dummy trench gates 9 and a placement interval D2 (second placement interval) defined by a center-to-center distance between the trench gate 91 and the dummy trench gate 92 equal in depth to the trench gate 91 are set to satisfy a relationship of "D1=D2". The placement interval D1 between the dummy trench gates 9 is set to less than 15 μm, for example. The reason for this will be described later.

Although the IGBT 100 illustrated in FIG. 1 shows a structure of a ⅝ thinning placement in which trench gates and dummy trench gates are arranged at a ratio of 1:5, the present disclosure is not limited to this.

<Improvement in Capacitance-Voltage Characteristics>

FIG. 2 illustrates an equivalent circuit of parasitic capacitance of the IGBT 100. As illustrated in FIG. 2, a gate-collector capacitance Cgc exists between a gate G and a collector C of the IGBT 100, a gate-emitter capacitance Cge exists between the gate G and an emitter E, and a collector-emitter capacitance Cce exists between the collector C and the emitter E.

The gate-collector capacitance Cgc and the gate-emitter capacitance Cge define an input capacitance Cies (Cies=Cgc+Cge), the collector-emitter capacitance Cce and the gate-collector capacitance Cgc define an output capacitance Coes (Coes=Cce+Cgc), and the gate-collector capacitance Cgc defines a feedback capacitance Cres (Cres=Cgc).

When the input capacitance Cies and the feedback capacitance Cres decrease, switching operation of a device becomes faster and a switching loss can be reduced. Although the input capacitance Cies is mainly determined by the gate-emitter capacitance Cge, the output capacitance Coes and the feedback capacitance Cres depend on even depletion in the drift layer 1.

Here, when a negative bias is applied to a pn junction, doped impurities are ionized and depleted from an interface of the pn junction to a p-side and an n-side. Then, the p-side is negatively charged and the n-side is positively charged, so that the pn junction is charged up like a single capacitance. The capacitance is given as electric charge (charge) accumulated per unit voltage, and magnitude of the charge is determined by the amount of impurities. The n-side of the pn junction of the first preferred embodiment is the drift layer 1 (n−), and the output capacitance Coes and the feedback capacitance Cres depend on an n-type impurity concentration of the drift layer 1.

Although a calculation of capacitance of a parallel plate capacitor is the simplest calculation of capacitance, and the capacitance can be calculated using a dielectric constant, a distance between electrode plates, and an area of the electrode plates, a prerequisite is that the electrode plates each have an area sufficiently larger than a value of the square of the distance between the electrode plates. When the pn junction satisfies this precondition, the depletion on the p-side and the n-side is uniform, and thus the capacitance can be calculated approximately as a parallel plate capacitor.

The above consideration has reached a technical idea of preventing peculiar capacitance-voltage characteristics even in the structure with a trench gate and a dummy trench gate by bringing a pn junction close to that allowing capacitance to be calculated as a parallel plate capacitor.

Here, with reference to FIGS. 3 and 4, a comparison result of capacitance-voltage characteristics will be described by comparing a conventional IGBT, in which only dummy trench gates each having a trench deeper than trench gates are disposed between the trench gates adjacent to each other, to the IGBT 100 of the first preferred embodiments in which the dummy trench gates 9 and 92 are disposed.

Figure 3:
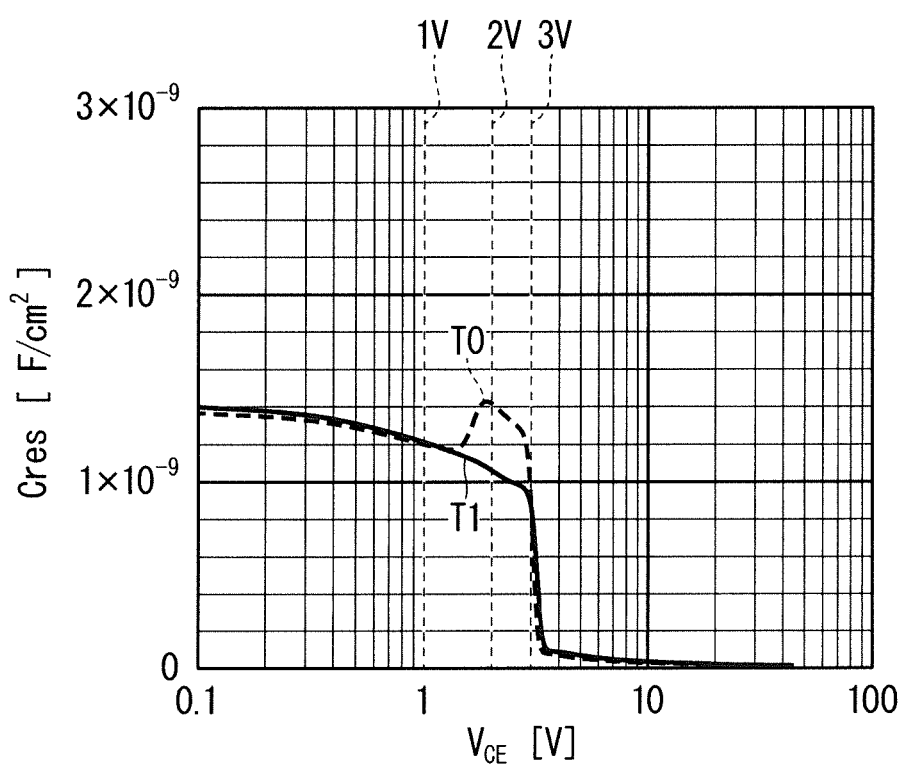

FIG. 3 is a graph showing a simulation result of capacitance-voltage characteristics between the feedback capacitance Cres [F/cm$^2$] and collector-emitter voltage $V_{CE}$ [V]. FIG. 4 is a graph showing a simulation result of capacitance-voltage characteristics between the output capacitance Coes [F/cm$^2$] and the collector-emitter voltage $V_{CE}$ [V]. FIGS. 3 and 4 each show a characteristic T1 that indicate the characteristics of the IGBT 100 of the first preferred embodiment, and a characteristic T0 that indicate the characteristics of the conventional IGBT. FIGS. 3 and 4 each show the collector-emitter voltage $V_{CE}$ that is changed in a range of 0 to 50 V, at an operating frequency of 100 kHz, and an environmental temperature of 25° C. FIGS. 3 and 4 each show the characteristics in a ⅚ thinning placement in which trench gates and dummy trench gates are disposed at a ratio of 1:5.

FIG. 3 shows a waveform of the feedback capacitance Cres that shows a phenomenon in which capacitance rapidly increases while the collector-emitter voltage $V_{CE}$ changes from 1 V to 3 V. FIG. 4 shows a waveform of the output capacitance Coes, having a falling portion of the characteristic T0 in a stepped shape, and the falling portion is considered to be affected by the rapid increase of the feedback capacitance Cres.

In contrast, FIGS. 3 and 4 each show no peculiar portion in the characteristic T1, and thus it can be said that capacitance-voltage characteristics can be prevented from becoming peculiar in the IGBT 100 having the trench gates and the dummy trench gates.

Figure 6:
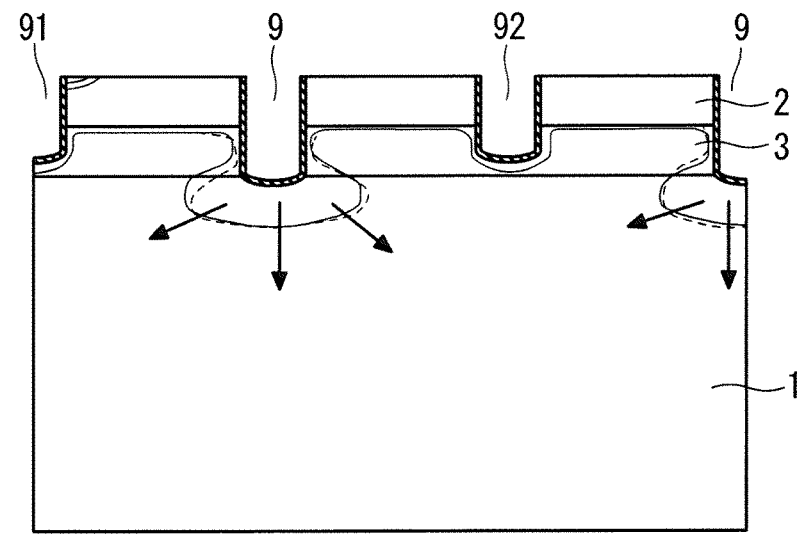
FIG. 6 is a diagram illustrating an internal analysis result using a simulation of the IGBT according to the first preferred embodiment.
Figure 6:
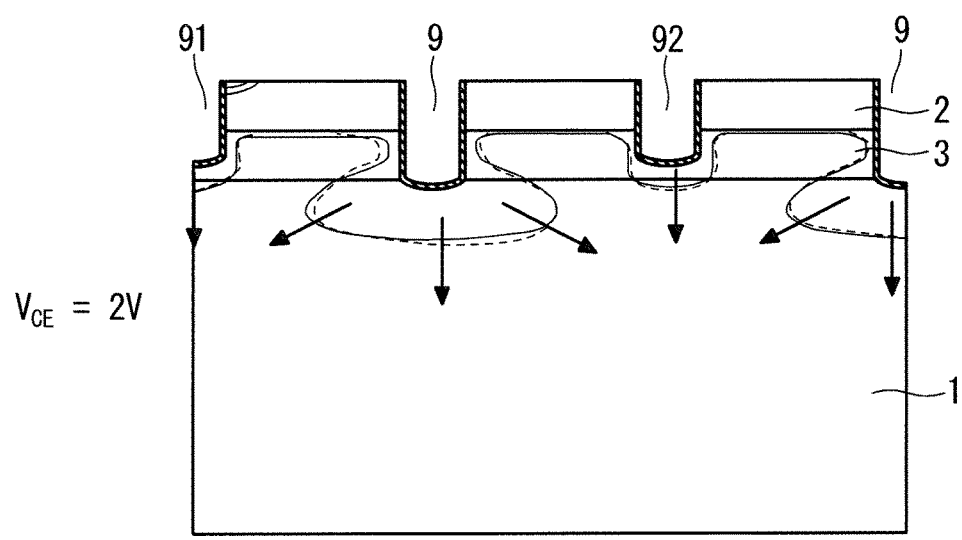
Figure 6:
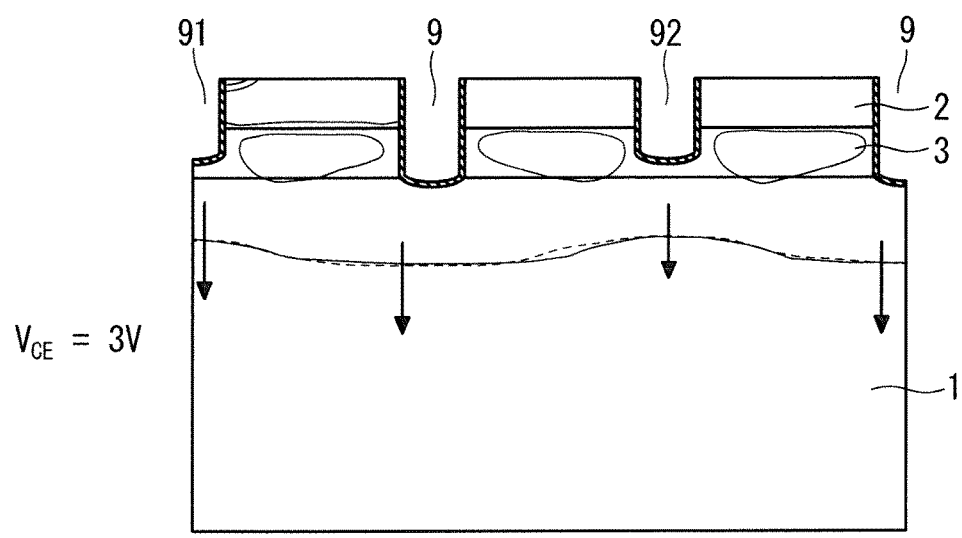

Next, the reason why the capacitance-voltage characteristics of the IGBT 100 can be prevented from becoming peculiar will be described with reference to FIGS. 5 and 6. FIG. 5 is a diagram illustrating an internal analysis result using a simulation of the conventional IGBT, and FIG. 6 is a diagram illustrating an internal analysis result using a simulation of the IGBT 100. FIGS. 5 and 6 each show a depletion layer with a solid line at a collector-emitter voltage $V_{CE}$ of each of 1 V, 2 V, and 3 V.

FIGS. 5 and 6 show the results under the same simulation conditions having an impurity concentration of each impurity layer within the concentration range of the IGBT 100 described above, and a breakdown voltage of 3300 V class. FIGS. 5 and 6 each show the results in a ⅚ thinning placement in which trench gates and dummy trench gates are disposed at a ratio of 1:5.

The conventional IGBT illustrated in FIG. 5 is configured such that only a deep dummy trench gate 9 is disposed between trench gates 91 adjacent to each other, and a depletion layer formed by the dummy trench gate 9 due to increase in the collector-emitter voltage $V_{CE}$ penetrates into the depths of the substrate. However, a depletion layer formed by the trench gate 91 shallower than the dummy trench gate 9 does not penetrate into the depths of the substrate to cause the depletion layers to be nonuniform in the depth direction. This turns out that the conventional IGBT cannot be approximated as a parallel plate capacitor.

In contrast, the IGBT 100 illustrated in FIG. 6 is configured such that a deep dummy trench gate 9 and a shallow dummy trench gate 92 are alternately provided between trench gates 91 adjacent to each other, and a depletion layer formed by the dummy trench gate 9 due to increase in the collector-emitter voltage $V_{CE}$ penetrates into the depths of the substrate. However, depletion layers formed by the shallow trench gate 91 and the shallow dummy trench gate 92 uniformize the depletion layers as a whole. This turns out that the IGBT 100 can be approximated as a parallel plate capacitor.

As described above, the IGBT 100 is configured such that the dummy trench gates 9 and the dummy trench gates 92 are alternately disposed between the trench gates 91 arrayed, and the dummy trench gates 9 are disposed adjacent to the corresponding trench gates 91. This enables the IGBT 100 to bring a pn junction close to that allowing capacitance to be calculated as a parallel plate capacitor, so that capacitance-voltage characteristics can be prevented from becoming peculiar.

When the placement interval D1 between the dummy trench gates 9 and the placement interval D2 between the trench gate 91 and the dummy trench gate 92 are set to satisfy the relationship of "D1=D2", the trench gate 91, the dummy trench gate 9, and the dummy trench gate 92 are disposed at equal intervals, and thus enabling the capacitance-voltage characteristics to be further improved.

<Manufacturing Method>

Next, a method for manufacturing the IGBT 100 will be described with reference to FIGS. 7 to 18 that are each a sectional view illustrating a manufacturing step in order. In the following, to illustrate and describe mainly a manufacturing step of the trench gate 91 and the dummy trench gate 9 using a sectional view illustrating a more realistic structure, the collector electrode 16 and the like are eliminated.

Figure 7:
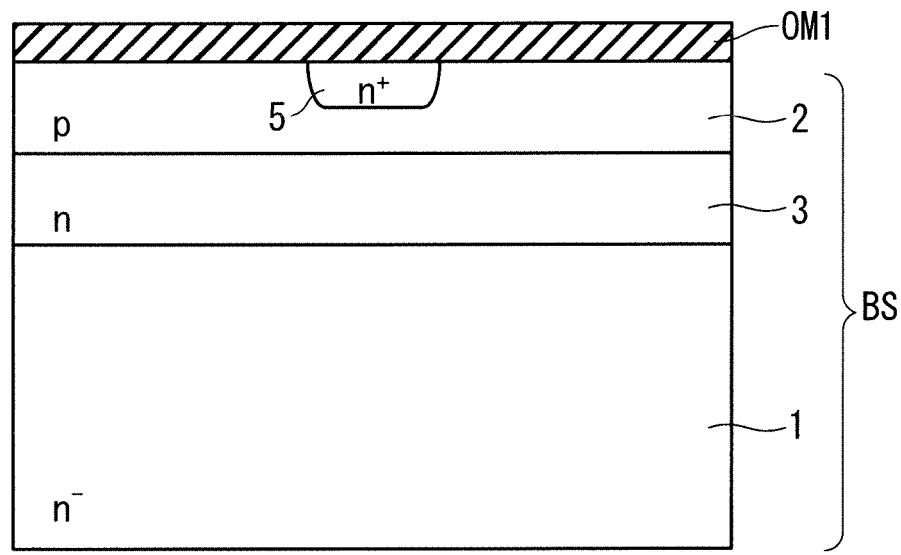
FIGS. 7 to 18 are each a sectional view illustrating a manufacturing step of the semiconductor device of the first preferred embodiment.

In the step illustrated in FIG. 7, a silicon oxide film OM1 is formed by, for example, a chemical vapor deposition (CVD) method or the like on an upper main surface of the semiconductor substrate BS in which an n-type emitter layer 5 is selectively formed in an upper layer portion of a p-type channel layer 2. Although a p-type emitter layer 4 may be formed in contact with the n-type emitter layer 5, the present step eliminates this process.

Figure 8:
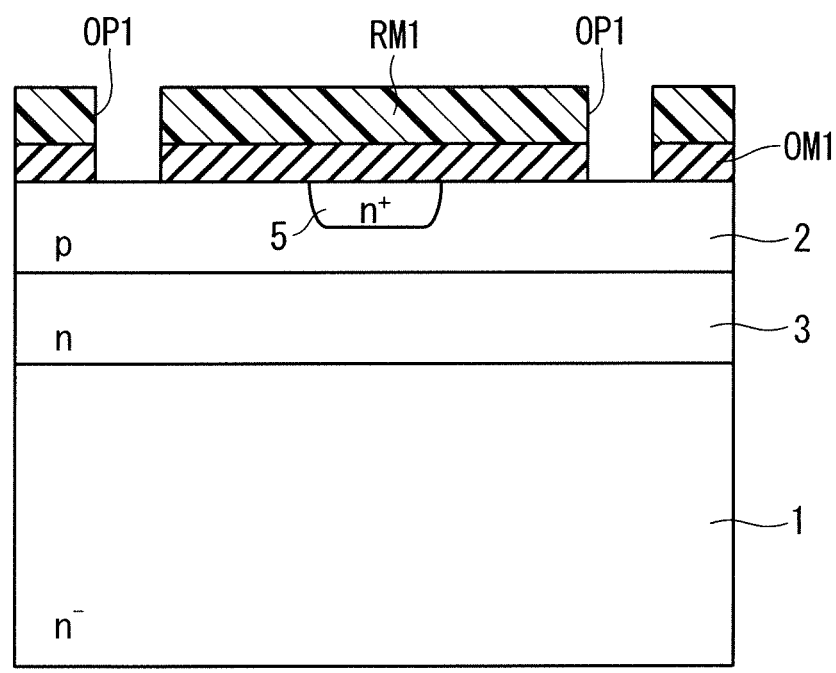

Next, in the step illustrated in FIG. 8, a resist material is applied on the silicon oxide film OM1 and a resist mask RM1 is formed by photolithography. The resist mask RM1 is provided with an opening OP1 corresponding to a position where a dummy gate trench 8 is to be formed. Etching the silicon oxide film OM1 using this resist mask RM1 allows a portion corresponding to the opening OP1 to be opened, and then the resist mask RM1 is removed.

Figure 9:
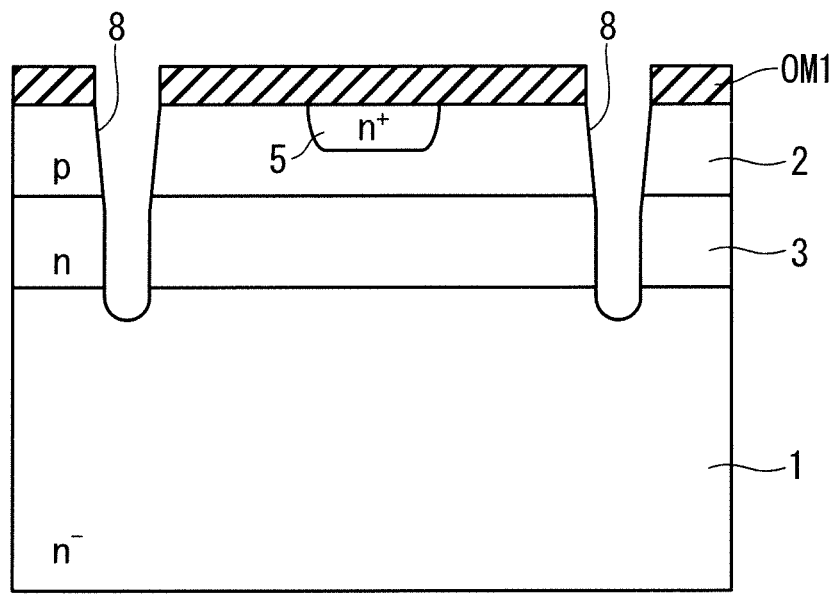

Next, in the step illustrated in FIG. 9, the silicon oxide film OM1 is used as an etching mask to form a dummy gate trench 8, which passes through the channel layer 2 and an n-type carrier store layer 3 in the thickness direction to penetrate into an n-type drift layer 1, by etching. This etching may be dry etching or wet etching, and the dummy gate trench 8 can be formed using a conventional etching technique. Thus, although description of detailed etching conditions and the like is eliminated, the etching is performed while etching conditions are controlled to allow the dummy gate trench 8 to have a side surface that is a taper surface decreasing in width toward its bottom portion.

Figure 10:
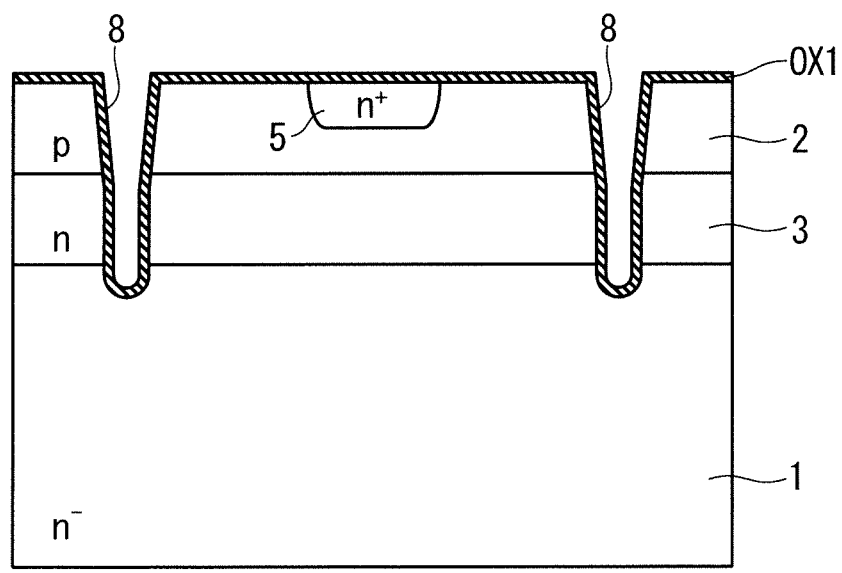

After the silicon oxide film OM1 is removed, a silicon oxide film OX1 having a thickness of about 100 nm is formed on a surface of the semiconductor substrate BS including an inner surface of the dummy gate trench 8 by thermal oxidation, for example, in the step illustrated in FIG. 10. The silicon oxide film OX1 may be formed not only by the thermal oxidation but also by a CVD method or the like.

Figure 11:
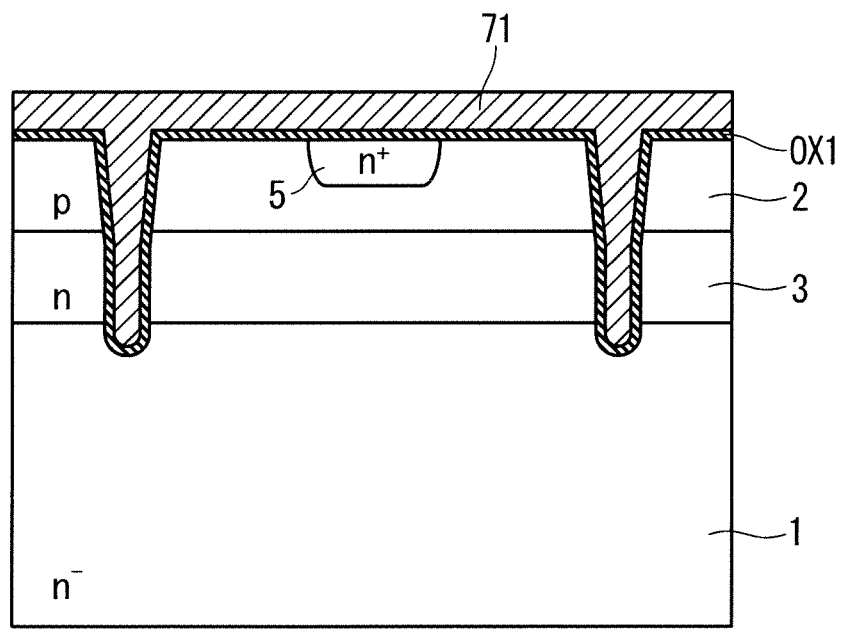

Next, in the step illustrated in FIG. 11, a doped polysilicon film 71 to which phosphorus is added is deposited on the silicon oxide film OX1 by, for example, the CVD method to fill the dummy gate trench 8 with the doped polysilicon film 71.

Figure 12:
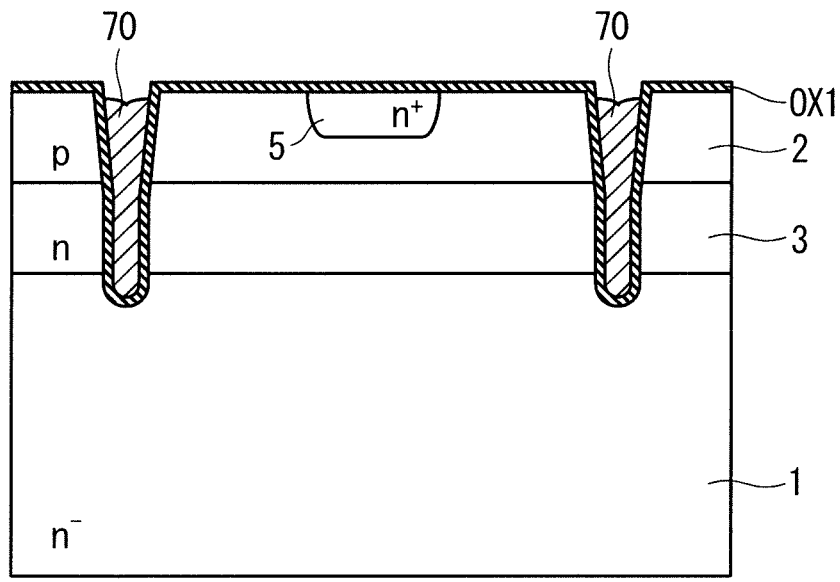

Next, in the step illustrated in FIG. 12, the doped polysilicon film 71 on the silicon oxide film OX1 other than that in the dummy gate trench 8 is removed, and a dummy gate electrode 70 is formed in the dummy gate trench 8.

Figure 13:
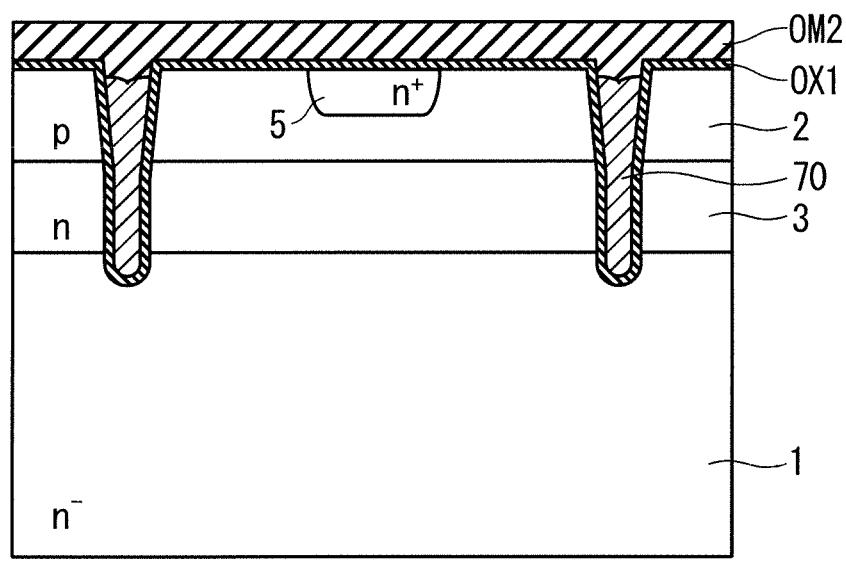

Next, in the step illustrated in FIG. 13, a silicon oxide film OM2 is formed on the silicon oxide film OX1 by, for example, the CVD method.

Figure 14:
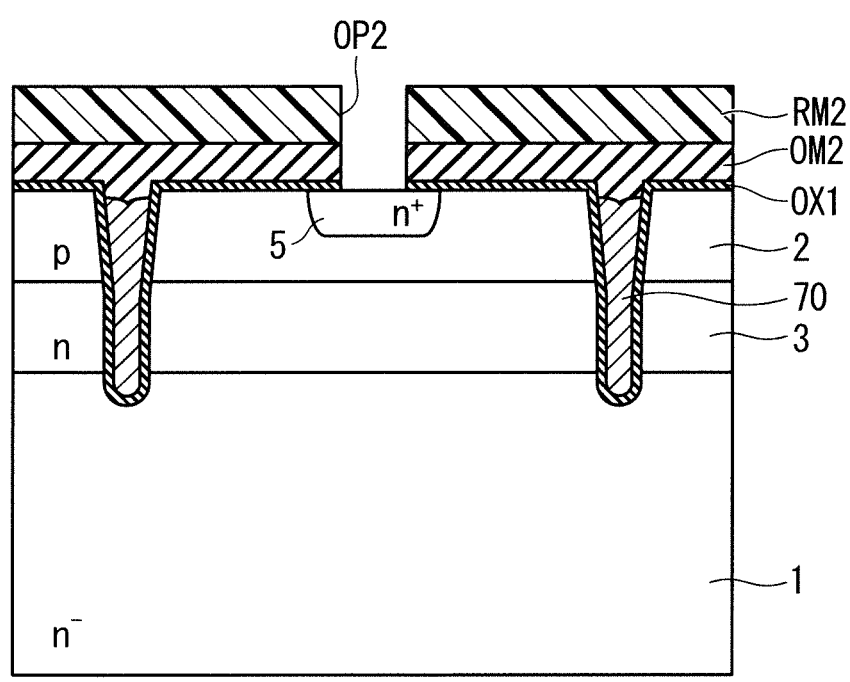

Next, in the step illustrated in FIG. 14, a resist material is applied on the silicon oxide film OM2 and a resist mask RM2 is formed by photolithography. The resist mask RM2 is provided with an opening OP2 corresponding to a position where a gate trench 81 is formed. Etching the silicon oxide film OM2 using this resist mask RM2 allows a portion corresponding to the opening OP2 to be opened, and then the resist mask RM2 is removed.

Figure 15:
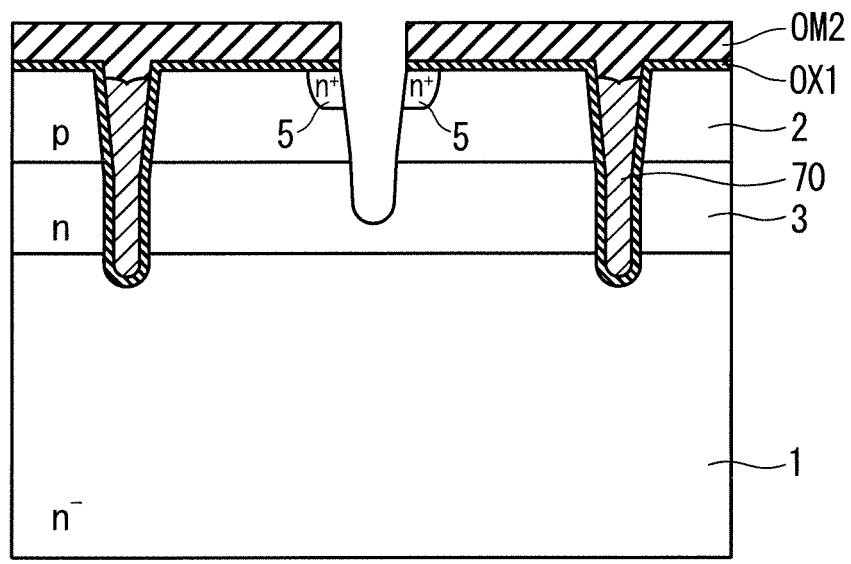

Next, in the step illustrated in FIG. 15, the silicon oxide film OM2 is used as an etching mask to form the gate trench 81, which passes through the emitter layer 5 and the channel layer 2 in the thickness direction to penetrate into the n-type carrier store layer 3, by etching. Although not illustrated, a dummy gate trench 82 equal in depth is also formed simultaneously with the gate trench 81. This etching may be dry etching or wet etching, and the dummy gate trench 8 can be formed using a conventional etching technique. Thus, although description of detailed etching conditions and the like is eliminated, the etching is performed while etching conditions are controlled to allow each of the gate trench 81 and the dummy gate trench 82 to have a side surface that is a taper surface decreasing in width toward its bottom portion.

Figure 16:
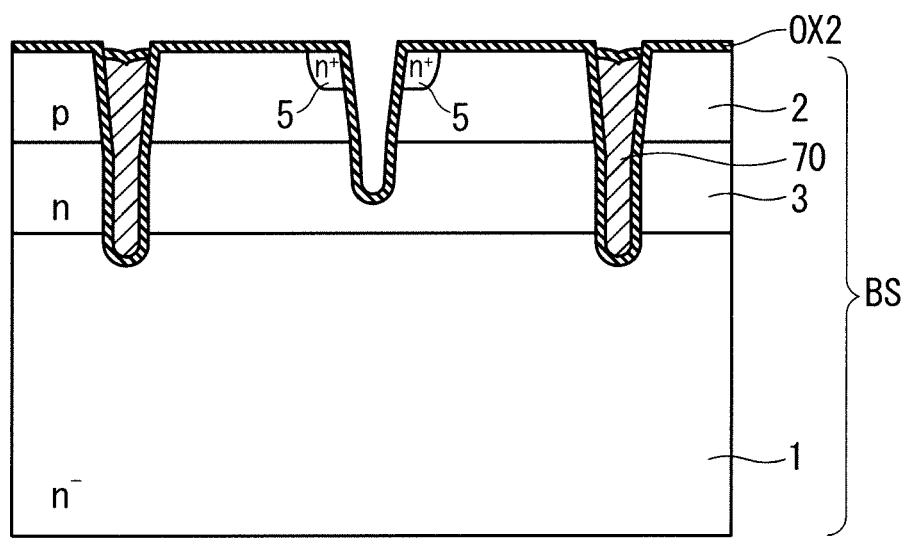

After the silicon oxide film OM2 and the silicon oxide film OX1 thereunder are removed, a silicon oxide film OX2 having a thickness of about 100 nm is formed on a surface of the semiconductor substrate BS including an inner surface of the gate trench 81 by thermal oxidation, for example, in the step illustrated in FIG. 16. The silicon oxide film OX2 may be formed not only by the thermal oxidation but also by the CVD method or the like. Although not illustrated, the silicon oxide film OX2 is also formed on an inner surface of the dummy gate trench 82.

Figure 17:
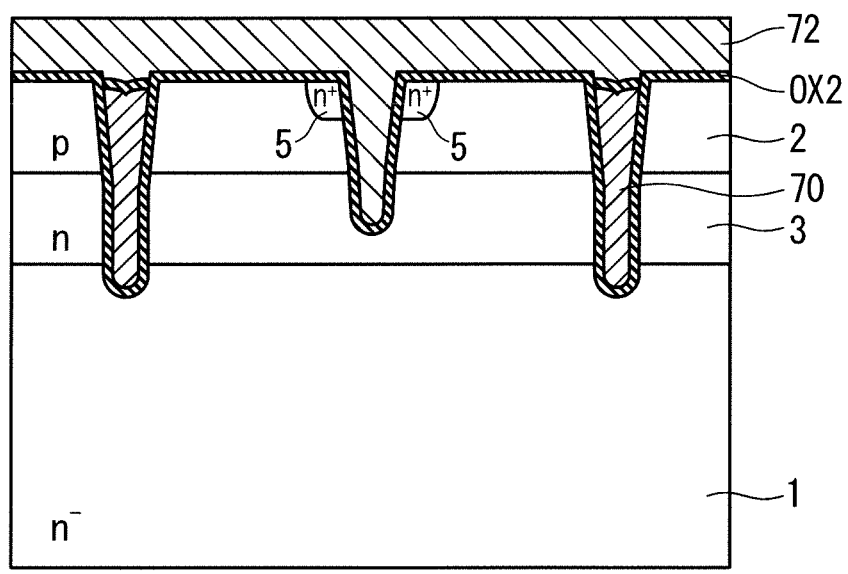

Next, in the step illustrated in FIG. 17, a doped polysilicon film 72 to which phosphorus is added is deposited on the silicon oxide film OX2 by, for example, the CVD method to fill the gate trench 81 with the doped polysilicon film 72. Although not illustrated, the dummy gate trench 82 is also filled with the doped polysilicon film 72.

Figure 18:
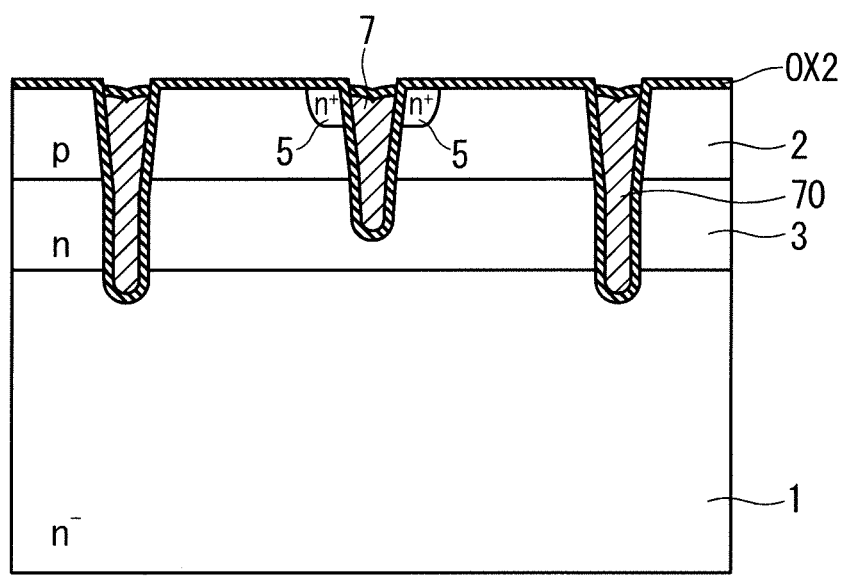

Next, in the step illustrated in FIG. 18, the doped polysilicon film 72 on the silicon oxide film OX2 other than in the gate trench 81 is removed, and a gate electrode 7 is formed in the gate trench 81. At the same time, the dummy gate electrode 70 is formed in the dummy gate trench 82 (not illustrated).

After that, through an unillustrated manufacturing step, an interlayer insulating film 14, an emitter electrode 15, and the like are formed to complete the IGBT 100.

In this way, the dummy gate trench 8 and the gate trench 81 (dummy gate trench 82) are formed in a photolithography step and an etching step, respectively.

<Placement Interval of Dummy Trench Gates>

Although the placement interval D1 (FIG. 1) between the dummy trench gates 9 is described as being set to, for example, 15 μm or less, the reason for this will be described with reference to FIG. 19.

Figure 19:
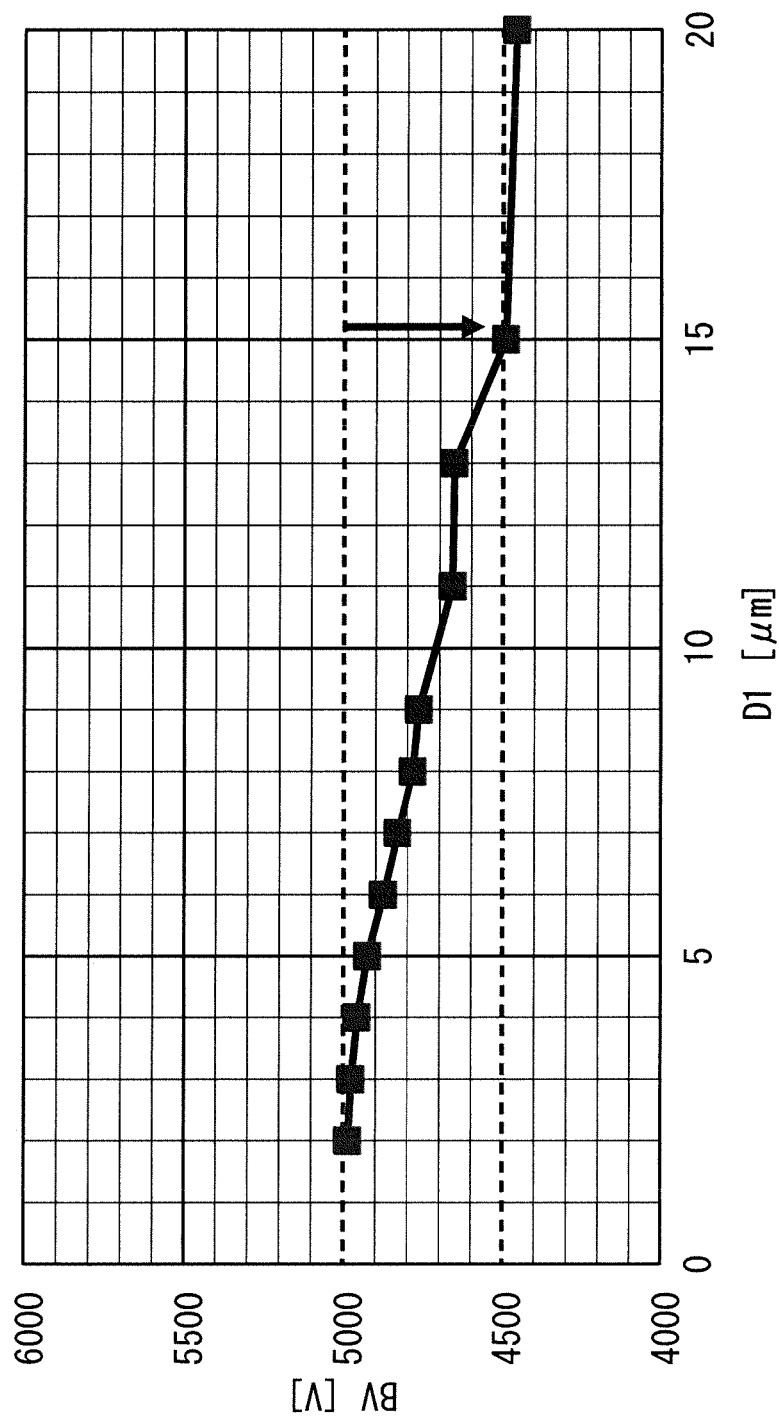
FIG. 19 is a graph showing placement intervals of dummy trench gates.

FIG. 19 is a graph showing a relationship between breakdown voltage of the IGBT 100 and the placement interval D1 between the dummy trench gates 9, where the horizontal axis represents the placement interval D1 and the vertical axis represents the breakdown voltage BV [V] at an ambient temperature of 25° C. It can be seen from FIG. 19 that the breakdown voltage decreases as the placement interval D1 increases. FIG. 19 shows dependence of the breakdown voltage on the placement interval D1 when the n-type carrier store layer 3 has a dosage of impurities of zero, i.e., when the carrier store layer 3 is not provided. When the placement interval D1 was set to 15 μm, the breakdown voltage decreased by 10% from a target breakdown voltage (5000 V) to about 90% (4500 V) of the target breakdown voltage. This is because an excessive placement interval D1 reduces field plate effect between the dummy trench gates 9 to cause an electric field to concentrate near the bottom of the dummy trench gate 9.

In contrast, when the carrier store layer 3 is provided, the dependence of the breakdown voltage on the placement interval D1 increases as a concentration of n-type impurities increases. Thus, the placement interval D1 is set to less than 15 μm to secure breakdown voltage equal to or more than 90% of the target breakdown voltage.

As shown in FIG. 19, when the carrier store layer 3 is not provided, the placement interval D1 may be about 15 μm. Although the placement interval D1 may have a lower limit value of 2 to 3 μm, for example, to desirably achieve the target breakdown voltage, according to FIG. 19, the placement interval is set to facilitate formation of a trench in consideration of a depth of the trench, an opening width of the trench, and the like.

The field plate effect is an effect of reducing an electric field caused by a field plate formed of a multilayer structure of a conductor, an insulating film, and a semiconductor provided at the boundary of a pn junction, where the semiconductor corresponds to the n-type drift layer 1, the insulating film corresponds to the gate oxide film 6, and the conductor correspond to each of the gate electrode 7 and the dummy gate electrode 70. The pn junction between the n-type carrier store layer 3 and the p-type channel layer 2 originally generates a high electric field. However, the electric field can be reduced by a field plate effect of the deep dummy trench gate 9.

Second Preferred Embodiment

<Device Structure>

Figure 20:
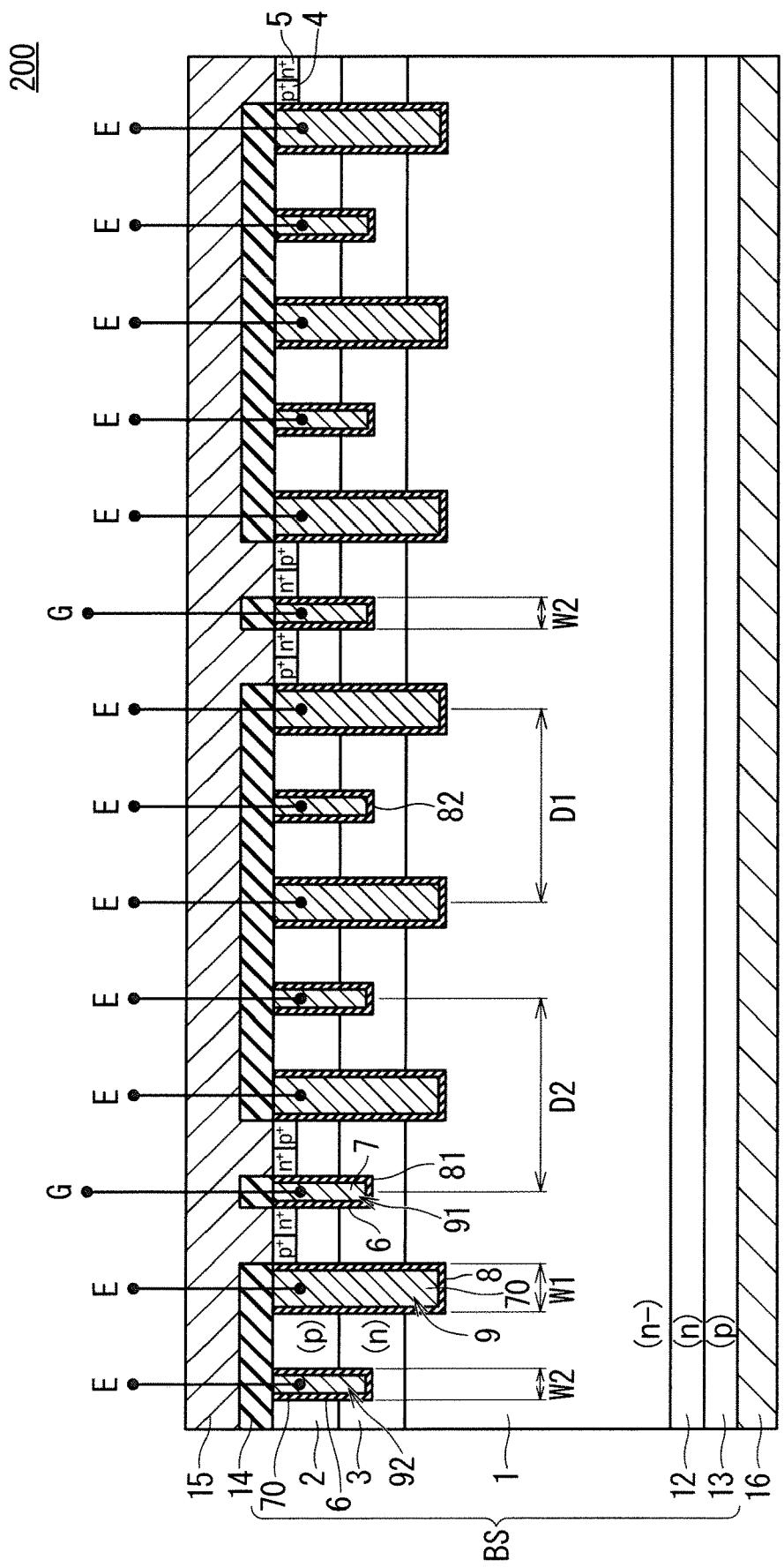
FIG. 20 is a sectional view illustrating a structure of an IGBT according to a second preferred embodiment.

FIG. 20 is a sectional view illustrating a structure of an IGBT 200 according to a second preferred embodiment. Although the IGBT 100 illustrated in FIG. 1 includes the dummy trench gates 9, 92 and the trench gate 91 that are equal in length in a direction perpendicular to an extending direction thereof, i.e., equal in trench width, the IGBT 200 includes trench gates 91 and dummy trench gates 92 each of which has a trench width W2 (second trench width) smaller than a trench width W1 (first trench width) of each of dummy trench gates 9, as illustrated in FIG. 20. In FIG. 20, the same components as those of the IGBT 100 described with reference to FIG. 1 are denoted by the same reference numerals, and duplicated description is eliminated.

When each of the trench gate 91 and the dummy trench gate 92 has a smaller width than the dummy trench gate 9 as described above, all the trenches can be formed at the same time to enable the manufacturing step to be simplified.

Figure 21:
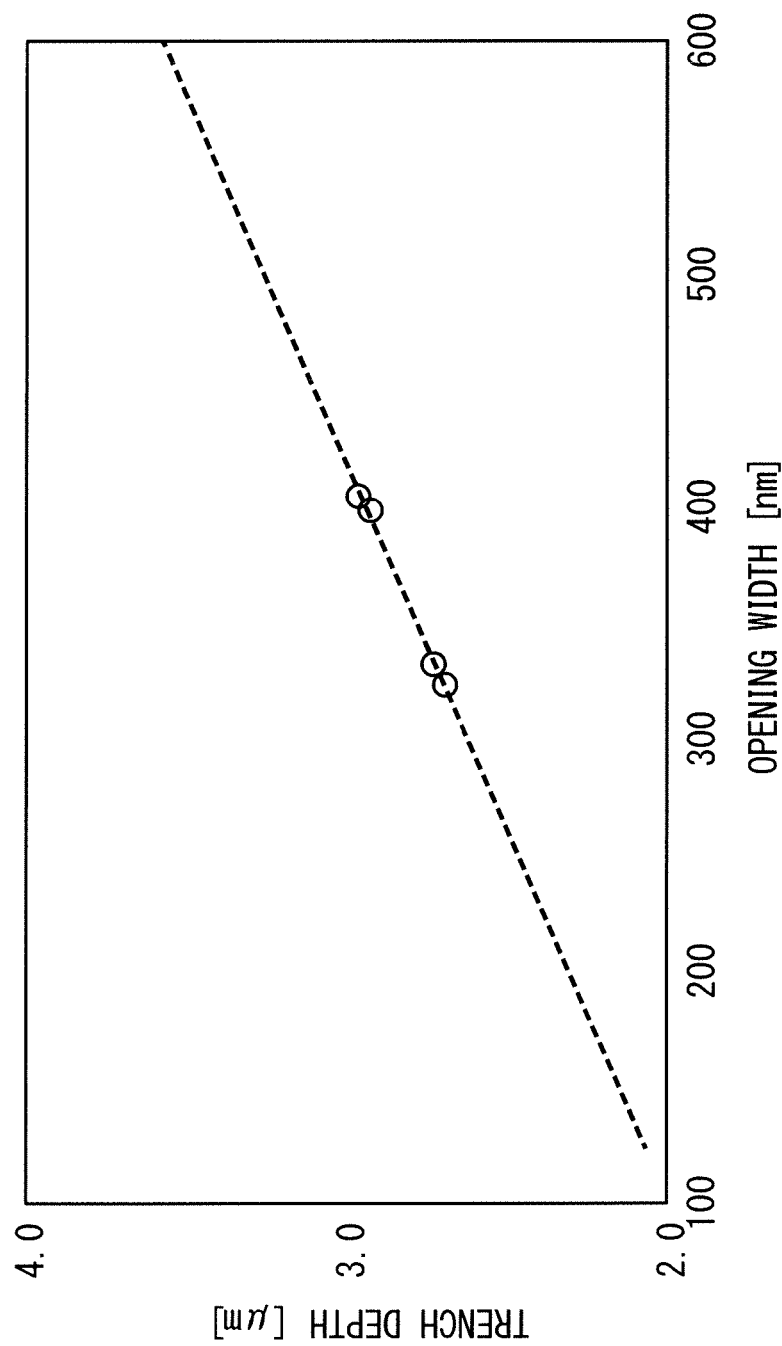
FIG. 21 is a graph showing a relationship between an opening width of an etching mask and a depth of a trench formed.

FIG. 21 is a graph showing a relationship between an opening width [nm] of an etching mask and a depth [μm] of a trench formed in a step of forming a trench by etching. As shown in FIG. 21, there is a correlation between the depth of the trench and the opening width of the etching mask, in which as the opening width of the etching mask decreases, the depth of the formed trench decreases. For example, when the etching mask has an opening width of 400 nm, the etching mask has a trench depth of about 3 μm. When the etching mask has an opening width of 300 nm, the etching mask has a trench depth of about 2.5 μm. Adjusting the etching conditions enables a slope and an absolute value of the correlation between the opening width of the etching mask and the trench depth to be adjusted. The reason why the opening width of the etching mask and the trench depth correlate with each other is that an etching rate increases as the opening width increases. However, when the opening width increases to more than a certain level, the correlation with the etching rate deteriorates.

Using the correlation between the opening width of the etching mask and the depth of the trench as described above enables the manufacturing step to be simplified.

<Manufacturing Method>

Hereinafter, a method for manufacturing the IGBT 200 will be described with reference to FIGS. 22 to 26 that are each a sectional view illustrating a manufacturing step in order. In the following, to illustrate and describe mainly a manufacturing step of the trench gate 91 and the dummy trench gate 9 using a sectional view illustrating a more realistic structure, the collector electrode 16 and the like are eliminated.

Figure 22:
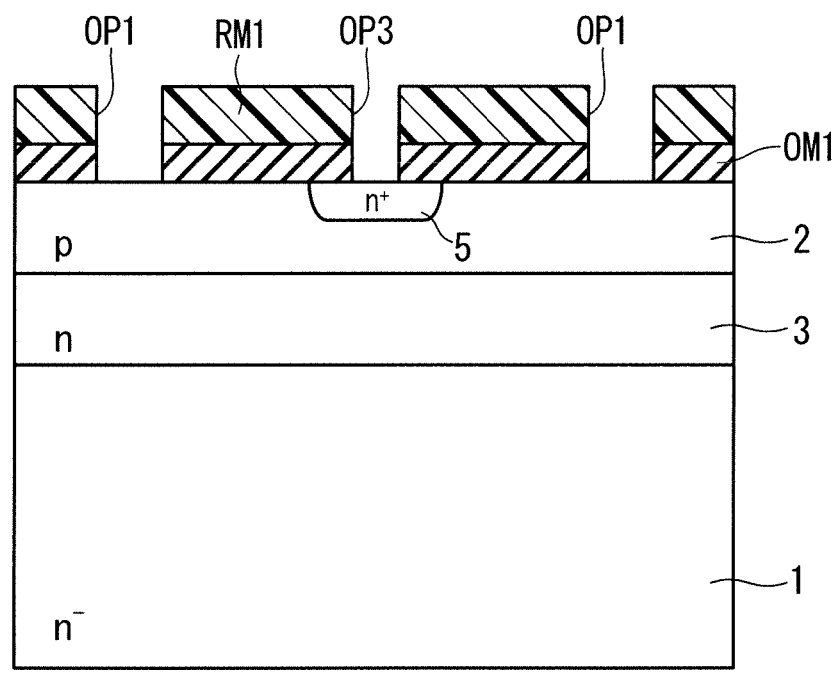
FIGS. 22 to 26 are each a sectional view illustrating a manufacturing step of the semiconductor device of the second preferred embodiment.

After the step described with reference to FIG. 7 in the first preferred embodiment, in the step illustrated in FIG. 22, a resist material is applied on a silicon oxide film OM1 and a resist mask RM1 is formed by photolithography. The resist mask RM1 is provided with an opening OP1 corresponding to a position where the dummy gate trench 8 is formed, and an opening OP3 corresponding to a position where the gate trench 81 and the dummy gate trench 82 (not illustrated) are formed. Etching the silicon oxide film OM1 using this resist mask RM1 allows portions corresponding to the openings OP1 and OP3 to be opened, and then the resist mask RM1 is removed.

Here, the opening OP1 is used to form the deep dummy gate trench 8, and thus is formed having an opening width larger than the opening OP3. For example, when the dummy gate trench 8 is desired to have a depth of about 3 μm, the opening OP1 is formed having an opening width of 400 nm according to FIG. 21. Meanwhile, when the gate trench 81 is desired to have a depth of about 2.5 μm, the opening OP3 is formed having an opening width of 300 nm according to FIG. 21.

Figure 23:
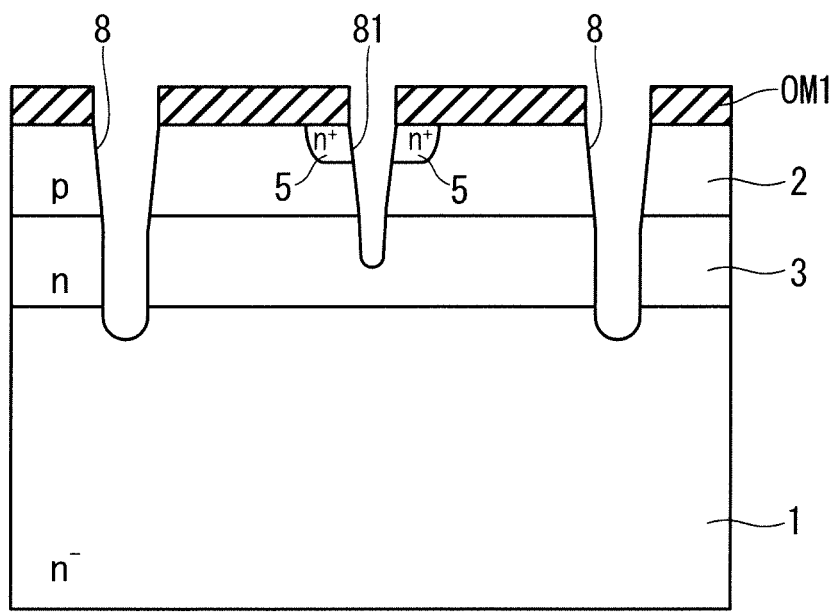

Next, in the step illustrated in FIG. 23, the silicon oxide film OM1 is used as an etching mask to form the dummy gate trench 8, which passes through the channel layer 2 and the n-type carrier store layer 3 in the thickness direction to penetrate into the n-type drift layer 1, and the gate trench 81, which passes through the emitter layer 5 and the channel layer 2 in the thickness direction to penetrate into the n-type carrier store layer 3, by etching. Although not illustrated, the dummy gate trench 82 equal in depth to the gate trench 81 is also formed. This etching may be dry etching or wet etching, and the dummy gate trench 8 can be formed using a conventional etching technique. Thus, although description of detailed etching conditions and the like is eliminated, the etching is performed while etching conditions are controlled to allow each of the gate trench 81 and the dummy gate trench 8 to have a side surface that is a taper surface decreasing in width toward its bottom portion.

Figure 24:
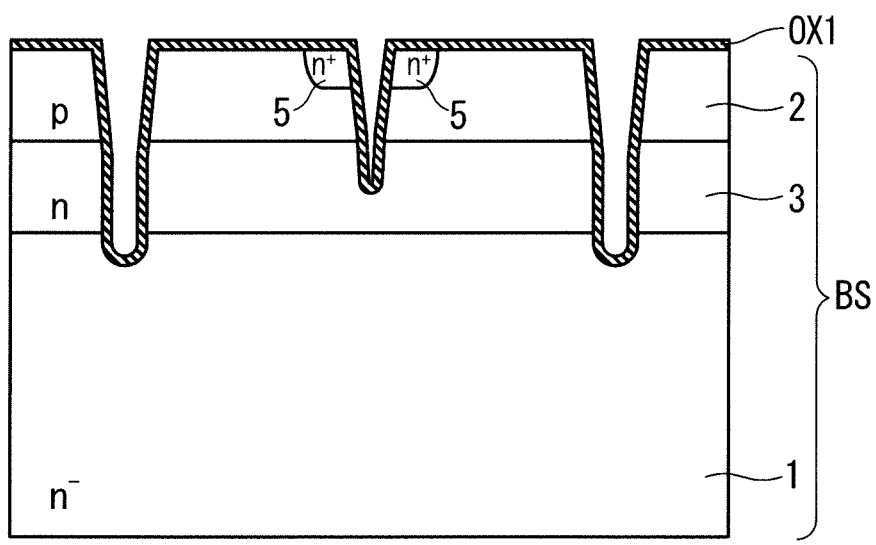

After the silicon oxide film OM1 is removed, a silicon oxide film OX1 having a thickness of about 100 nm is formed on a surface of the semiconductor substrate BS including an inner surface of each of the dummy gate trench 8, the gate trench 81, and the dummy gate trench 82 (not illustrated) by thermal oxidation, for example, in the step illustrated in FIG. 24. The silicon oxide film OX1 may be formed not only by the thermal oxidation but also by a CVD method or the like.

Figure 25:
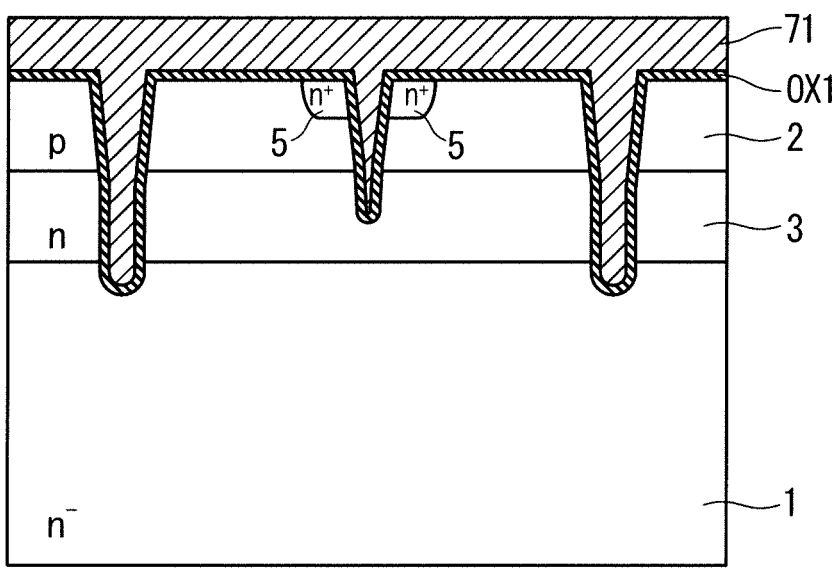

Next, in the step illustrated in FIG. 25, a doped polysilicon film 71 to which phosphorus is added is deposited on the silicon oxide film OX1 by, for example, the CVD method to fill the dummy gate trench 8, the gate trench 81, and the dummy gate trench 82 (not illustrated), with the doped polysilicon film 71.

Figure 26:
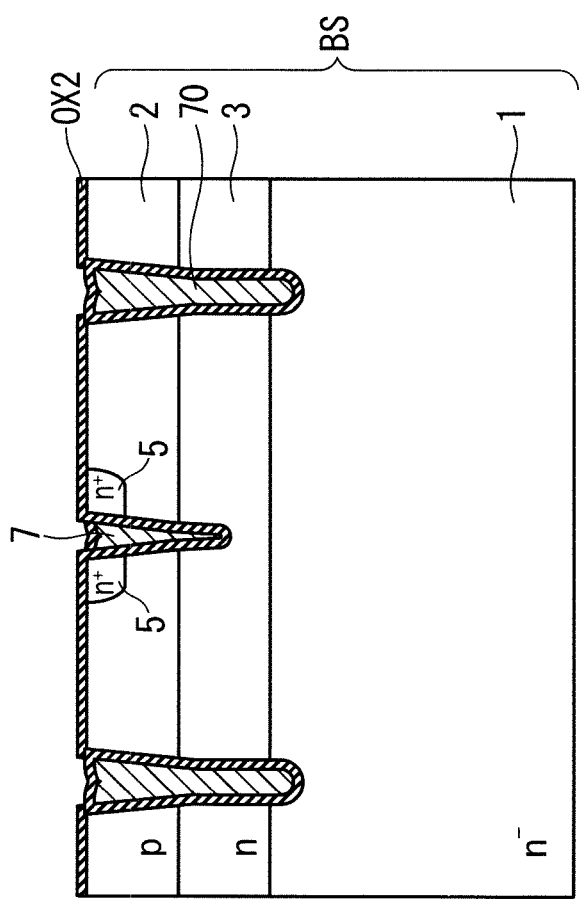

Next, in the step illustrated in FIG. 26, the doped polysilicon film 71 on the silicon oxide film OX1 other than that in each of the dummy gate trench 8, the gate trench 81, and the dummy gate trench 82 (not illustrated) is removed. Then a dummy gate electrode 70 is formed in each of the dummy gate trench 8 and the dummy gate trench 82 (not illustrated), and a gate electrode 7 is formed in the gate trench 81. Subsequently, after the silicon oxide film OX1 is removed, a silicon oxide film OX2 having a thickness of about 100 nm is formed on a surface of the semiconductor substrate BS by thermal oxidation, for example.

After that, through an unillustrated manufacturing step, an interlayer insulating film 14, an emitter electrode 15, and the like are formed to complete the IGBT 200.

As described above, the IGBT 200 allows all the trenches to be simultaneously formed by one photolithography and etching, so that the manufacturing step can be simplified. The gate electrode 7 and the dummy gate electrode 70 also can be simultaneously formed, so that the doped polysilicon film is required to be formed only once, and thus the manufacturing step can be simplified.

<First Modification>

Figure 27:
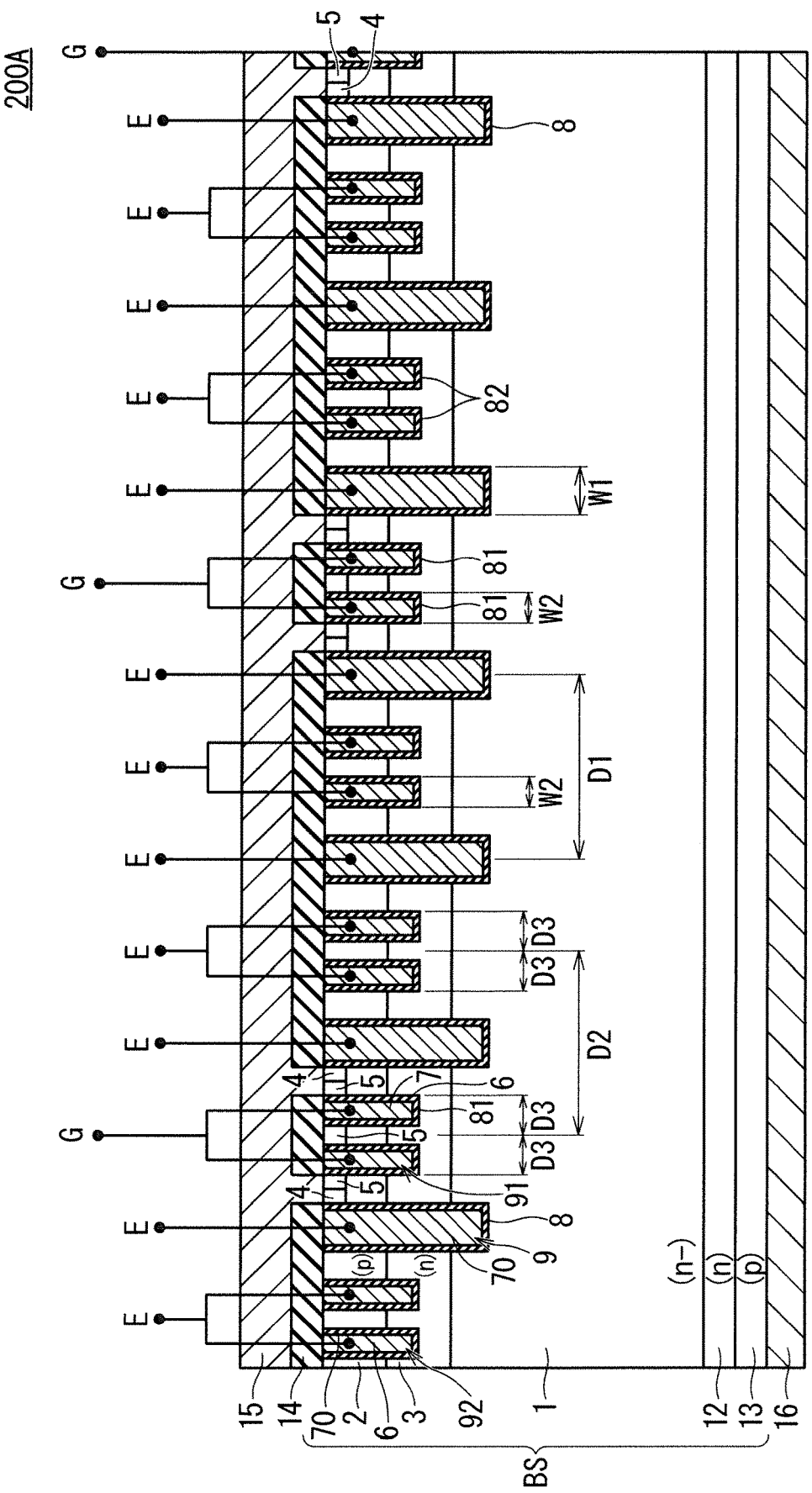
FIG. 27 is a sectional view illustrating a structure of an IGBT of a first modification of the preferred second embodiment.

FIG. 27 is a sectional view illustrating a structure of an IGBT 200A of a first modification of the preferred second embodiment. As illustrated in FIG. 27, the IGBT 200A is configured such that the trench gate 91 and the dummy trench gate 92 are each formed having a trench width W2 smaller than a trench width W1 of the dummy trench gate 9, and the trench gate 91 and the dummy trench gate 92 form a double gate structure in which two of the trench gates 91 are disposed in parallel to form a pair and two of the dummy trench gates 92 are disposed in parallel to form a pair.

The pair of trench gates 91 is disposed having a distance D3 from the center of the pair to an outer side surface of each of the trench gates 91, and the same applies to the pair of dummy trench gates 92.

Although a placement interval D2 between the pair of trench gates 91 and the pair of dummy trench gates 92 is defined by a center-to-center distance between the respective pairs, the placement interval D2 and a placement interval D1 between the dummy trench gates 9 are set to satisfy a relationship of "D1=D2". The placement interval D1 between the dummy trench gates 9 is set to less than 15 µm, for example.

Using the double gate structure increases the number of gates to increase gate capacitance, and thus extending a controllable range of switching operation by gate resistance.

<Second Modification>

Figure 28:
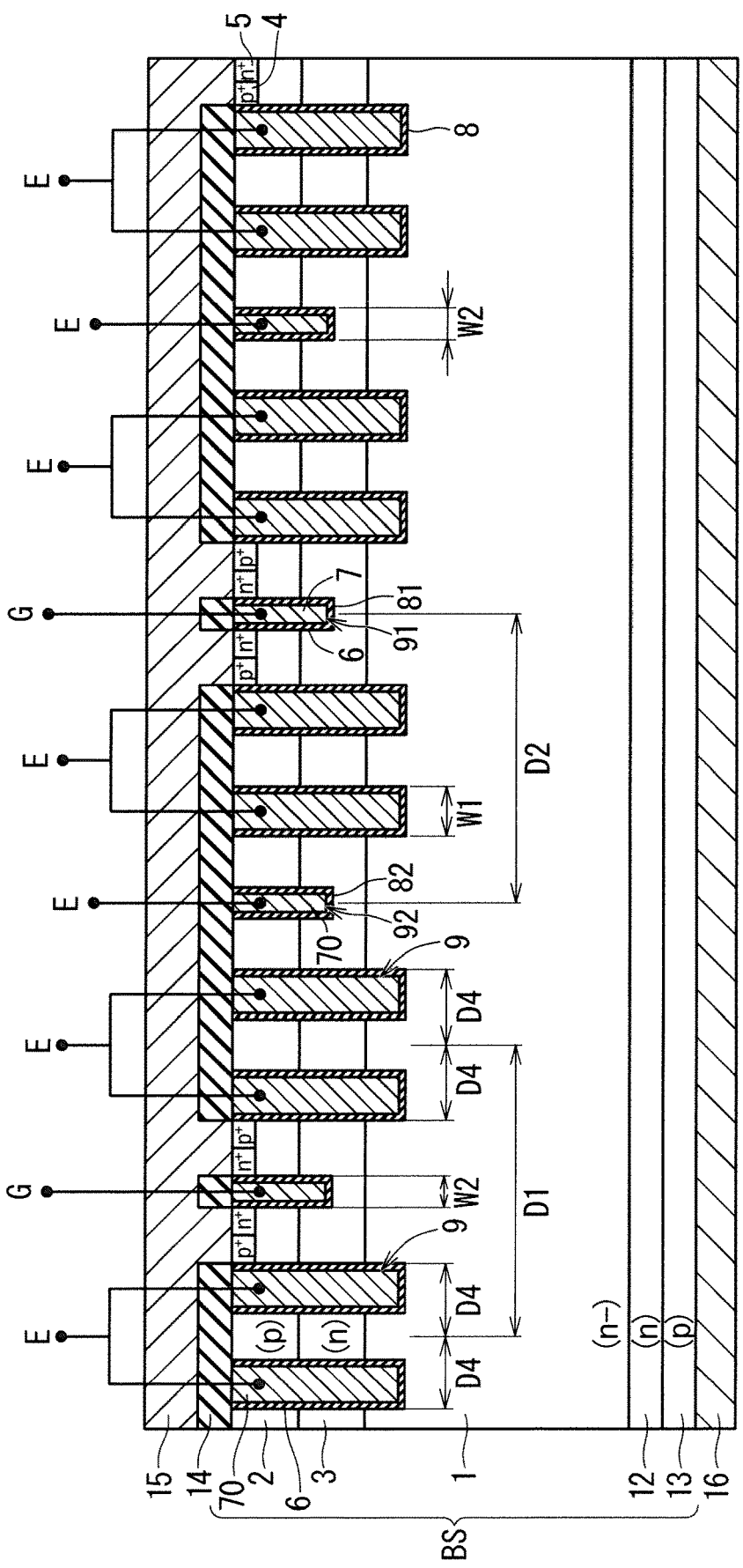
FIG. 28 is a sectional view illustrating a structure of an IGBT of a second modification of the preferred second embodiment.

FIG. 28 is a sectional view illustrating a structure of an IGBT 200B of a second modification of the preferred second embodiment. As illustrated in FIG. 28, the IGBT 200B is configured such that the trench gate 91 and the dummy trench gate 92 are each formed having a trench width W2 smaller than a trench width W1 of the dummy trench gate 9, and the dummy trench gate 9 forms a double gate structure in which two of the dummy trench gates 9 are disposed in parallel to form a pair.

The pair of dummy trench gates 9 is disposed having a distance D4 from the center of the pair to an outer side surface of each of the dummy trench gates 9. Although a placement interval D1 between pairs of dummy trench gates 9 is defined by a center-to-center distance between the respective pairs, the placement interval D1 and a placement interval D2 between the trench gate 91 and the dummy trench gate 92 are set to satisfy a relationship of "D1=D2". The placement interval D1 between the pair of dummy trench gates 9 is set to less than 15 µm, for example.

Using the double gate structure increases the number of gates to increase gate capacitance, and thus extending a controllable range of switching operation by gate resistance.

Other Application Examples

Although the first and second preferred embodiments described above are described by exemplifying the IGBT, the application of the dummy trench gate 9, the trench gate 91, and the dummy trench gate 92 described above is not limited to the IGBT. The first and second preferred embodiments can be applied to a metal oxide semiconductor field effect transistor (MOSFET) as long as it is an insulated gate transistor. When the first and second preferred embodiments are applied to a MOSFET, the p-type collector layer 13 is not provided and the collector electrode 16 functions as a drain electrode.

Within the scope of the present disclosure, each of the preferred embodiments may be freely combined, or each of the preferred embodiments may be appropriately modified or eliminated.

While the disclosure has been shown and described in detail, the foregoing description is in all aspects illustrative and not restrictive. It is therefore understood that numerous modifications and variations can be devised.

What is claimed is:

1. A semiconductor device comprising:
   a semiconductor substrate including at least:
      a first semiconductor layer of a first conductivity type;
      a second semiconductor layer of the first conductivity type on the first semiconductor layer and having a peak concentration of impurities that is higher than a peak concentration of impurities of the first semiconductor layer;
      a third semiconductor layer of a second conductivity type on the second semiconductor layer; and
      a fourth semiconductor layer of the first conductivity type that is selectively provided in an upper layer portion of the third semiconductor layer;
   plural trench gates passing through the fourth semiconductor layer and the third semiconductor layer in a thickness direction to terminate in the second semiconductor layer;
   a first dummy trench gate passing through the third semiconductor layer and the second semiconductor layer in the thickness direction to terminate in the first semiconductor layer;
   a second dummy trench gate passing through the third semiconductor layer in the thickness direction to terminate in the second semiconductor layer;
   a first main electrode in contact with at least the fourth semiconductor layer; and
   a second main electrode provided on the semiconductor substrate on a side opposite to the first main electrode in the thickness direction,
   the first and second dummy trench gates being disposed between the trench gates arrayed and being electrically connected to the first main electrode.

2. The semiconductor device according to claim 1, wherein
   the first and second dummy trench gates are alternately disposed between the trench gates arrayed such that the first dummy trench gate is disposed adjacent to the trench gate.

3. The semiconductor device according to claim 1, wherein
   the first dummy trench gate comprises at least two first dummy trench gates, and
   the trench gate, the first dummy trench gates, and second dummy trench gate are disposed such that a first placement interval, between the first dummy trench gates, and a second placement interval, between the trench gate and the second dummy trench gate, are equal to each other.

4. The semiconductor device according to claim 3, wherein
   the first dummy trench gates are disposed having the first placement interval less than 15 µm and greater than 0 µm.

5. The semiconductor device according to claim 1, wherein
   the trench gate and the first and second dummy trench gates are formed such that a second trench width of each of the trench gate and the second dummy trench gate is less than a first trench width of the first dummy trench gate.

6. The semiconductor device according to claim 5, wherein
   the first trench width and the second trench width are set based on a correlation between an opening width of an etching mask and a depth of a trench, in forming the trench by etching, to simultaneously form the trench gate, and the first and second dummy trench gates.

7. The semiconductor device according to claim 5, wherein
   two of the trench gates are disposed in parallel to form a pair,
   two of the second dummy trench gates are disposed in parallel to form a pair, and
   the trench gates and the first and second dummy trench gates are disposed such that a first placement interval between first dummy trench gates is equal to a second placement interval defined by a center-to-center distance between the pair of the trench gates and the pair of the second dummy trench gates.

8. The semiconductor device according to claim 5, wherein
two of the first dummy trench gates are disposed in parallel to form a pair, and
the trench gate and the first and second dummy trench gates are disposed such that a first placement interval defined by a center-to-center distance between pairs of the first dummy trench gates is equal to a second placement interval between the trench gate and the second dummy trench gate.

9. The semiconductor device according to claim 1, wherein
the first semiconductor layer is a drift layer, and
the second semiconductor layer is a carrier store layer.

* * * * *